(12) United States Patent
Nakamura et al.

(10) Patent No.: US 7,719,353 B2
(45) Date of Patent: May 18, 2010

(54) LINC AMPLIFYING DEVICE

(75) Inventors: Manabu Nakamura, Kodaira (JP); Taizo Ito, Kodaira (JP); Yoichi Okubo, Kodaira (JP); Naoki Hongo, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/379,137

(22) Filed: Feb. 13, 2009

(65) Prior Publication Data
US 2009/0231032 A1 Sep. 17, 2009

(30) Foreign Application Priority Data
Mar. 17, 2008 (JP) ............... 2008-066981

(51) Int. Cl.
*H03F 3/68* (2006.01)
(52) U.S. Cl. .................... 330/124 R; 330/295
(58) Field of Classification Search ............. 330/124 R, 330/295, 84, 126
See application file for complete search history.

(56) References Cited

U.S. PATENT DOCUMENTS

| | | | |
|---|---|---|---|
| 7,427,895 B1 * | 9/2008 | Okubo et al. ............ | 330/124 R |
| 7,486,136 B2 * | 2/2009 | Bakalski et al. .......... | 330/124 R |
| 7,498,878 B2 * | 3/2009 | Lim ....................... | 330/124 R |
| 7,595,688 B2 * | 9/2009 | Gandhi et al. ........... | 330/124 R |

FOREIGN PATENT DOCUMENTS

JP 2007-174148 7/2007

WO 99/52206 10/1999

OTHER PUBLICATIONS

A Vector-Locked Loop for Power Amplifier Linearization, Risto Kaunisto, Nokia Research Center, Itämerenkatu 11-13, FIN-00180 Helsinki, Finland.
Power Amplifiers and Transmitters for RF and Microwave, Frederick H. Raab, Peter Asbeck, Steve Cripps, Peter B. Kenington, Zoya B. Popovic, Nick Pothecary, John F. Sevic, and Nathan O. Sokal, IEEE Transactions on Microwave Theory and Techniques, vol. 50, No. 3, pp. 814-826, Mar. 2002.
Efficiency of Outphasing RF Power-Amplifier Systems, Frederick H. Raab, IEEE Transactions on Communications, vol. Com-33, No. 10, Oct. 1985.

(Continued)

*Primary Examiner*—Henry K Choe
(74) *Attorney, Agent, or Firm*—Bacon & Thomas, PLLC

(57) ABSTRACT

An amplifying apparatus includes a splitting unit for splitting an input signal into a first split signal and a second split signal; phase-shifting unit for phase-shifting the first split signal and the second split signal, respectively; a first amplifying unit for amplifying a first phase-shifted signal and outputting the signal as a first output signal; a second amplifying unit for amplifying, in a substantially identical manner to the first amplifying unit, a second phase-shifted signal and outputting the signal as a second output signal; and a matching unit for matching the first output signal and the second output signal to a first transmission unit and a second transmission unit, respectively. The first transmission unit is for transmitting the first output signal from the matching unit to a load resistor, and the second transmission unit is for transmitting the second output signal from the matching unit to the load resistor.

1 Claim, 6 Drawing Sheets

SECOND AMPLIFYING APPARATUS 2 (THIRD AMPLIFYING APPARATUS 3)

OTHER PUBLICATIONS

Chireix Power Combining with Saturated Class-B Power Amplifiers, Ilkka Hakala, Leila Gharavi, Risto Kaunisto, $12^{th}$ GAAS® Symposium-Amsterdam, 2004.

Implementation of an adaptive digital/RF predistorter using direct LUT synthesis, Microwave Symposium Digest, 2004 IEEE MTT-S International, vol. 2, pp. 681-684.

Digital Component Separator for future W-CDMA-LINC Transmitters implemented on an FPGA, W. Gerhard and R. Knöchel, Advances in Radio Science, 3, 239-246, 2005.

Effect of efficiency optimization on linearity of LINC amplifiers with CDMA signal, Jaehyok Yi, Youngoo Yang, and Bumman Kim, 2001 IEEE MTT-S Digest.

* cited by examiner

LINC AMPLIFYING DEVICE

FIELD OF THE INVENTION

The present invention relates to a LINC amplifying apparatus for amplifying an input signal.

BACKGROUND OF THE INVENTION

For example, Patent Document 1 to Non-Patent Document 7 disclose amplifying devices adopting the LINC system.

[Patent Document 1] Japanese Patent Laid-Open Application No. 2007-174148

[Patent Document 2] International Publication No. WO 99-52206

[Non-Patent Document 1] "A vector-locked loop for power amplifying device linearization" by Kaunisto Risto, Microwave Symposium Digest, IEEE MTT-SInternational, Vol. 2, p. 673-676, USA, June 2004

[Non-Patent Document 2] "Power amplifying devices and transmitters for RF and microwave" by F. H. Raab, P. Asbeck, S. Cripps, P. B. Kenington, Z. B. Popovic, N. Pothecary, J. F. Sevic, and N. O. Sokal, IEEE Transactions on Microwave Theory and Techniques, Vol. 50, No. 3, p. 814-826, USA, March 2002

[Non-Patent Document 3] "Efficiency of outphasing RF power-amplifying device systems" by F. H. Raab, IEEE Transactions on Communications, Vol. COM-33, No. 10, p. 1094-1099, October 1985

[Non-Patent Document 4] "Chireix Power Combining with Saturated Class-B Power Amplifying" by Ilkka Hakalal, Leila Gharavi and Risto Kaunisto, 12th GAAS Symposium-Amsterdam, 2004 (searched on Nov. 18, 2005), Internet URL: http://amsacta.cib.unibo.it/archive/00001005/01/GA042058.PDF

[Non-Patent Document 5] "Implementation of Adaptive Digital/RF Predistorter Using Diredt LUTSynthesis" by Boumaiza, S. and Jing Li, F. M. Ghannouchi, IEEE MTT-S, Vol. 2, p. 681-684, USA, 2004 [Non-Patent Document 6] "Digital Component Separator for W-CDMA-LINC Transmitters implemented on an FPGA" by W. Gerhard and R. Knochel, Advance in Radio Science, Vol. 3, p. 239-246, Germany, Copernicus GmbH, 2005

[Non-Patent Document 7] "Effect of efficiency optimization on linearity of LINC amplifying devices with CDMA signal" by Jaehyok Yi, Younggoo Yang and Bumman Kim, IEEE MTT-S International Microwave Symposium Digest, Vol. 2, p. 1359-1362, USA, 2001

SUMMARY OF THE INVENTION

The present invention provides an improved amplifying apparatus to amplify signals with high efficiency.

BRIEF DESCRIPTION OF THE DRAWINGS

The objects and features of the present invention will become apparent from the following description of preferred embodiments, given in conjunction with the accompanying drawings, in which.

DETAILED DESCRIPTION OF THE EMBODIMENTS

Hereinafter, the embodiments in accordance with the present invention will be described in detail with reference to the accompanying drawings.

First, a LINC (Linear Amplification With Nonlinear Components) system will be explained.

An LINC amplifying apparatus performs signal amplification by splitting an input signal into two signals of a same amplitude by a signal splitter; amplifying each of the split two signals by amplifying devices; and combining the amplified two signals by a combiner.

That is, the LINC amplifying apparatus splits an input signal into two signals of a same amplitude so that the amplifying devices always fully operated, thereby achieving a high-efficiency linear amplifying device.

(First Amplifying Apparatus 1)

Hereinafter, a first amplifying apparatus 1 as one example of LINC amplifying apparatus will be described.

Figure 1:
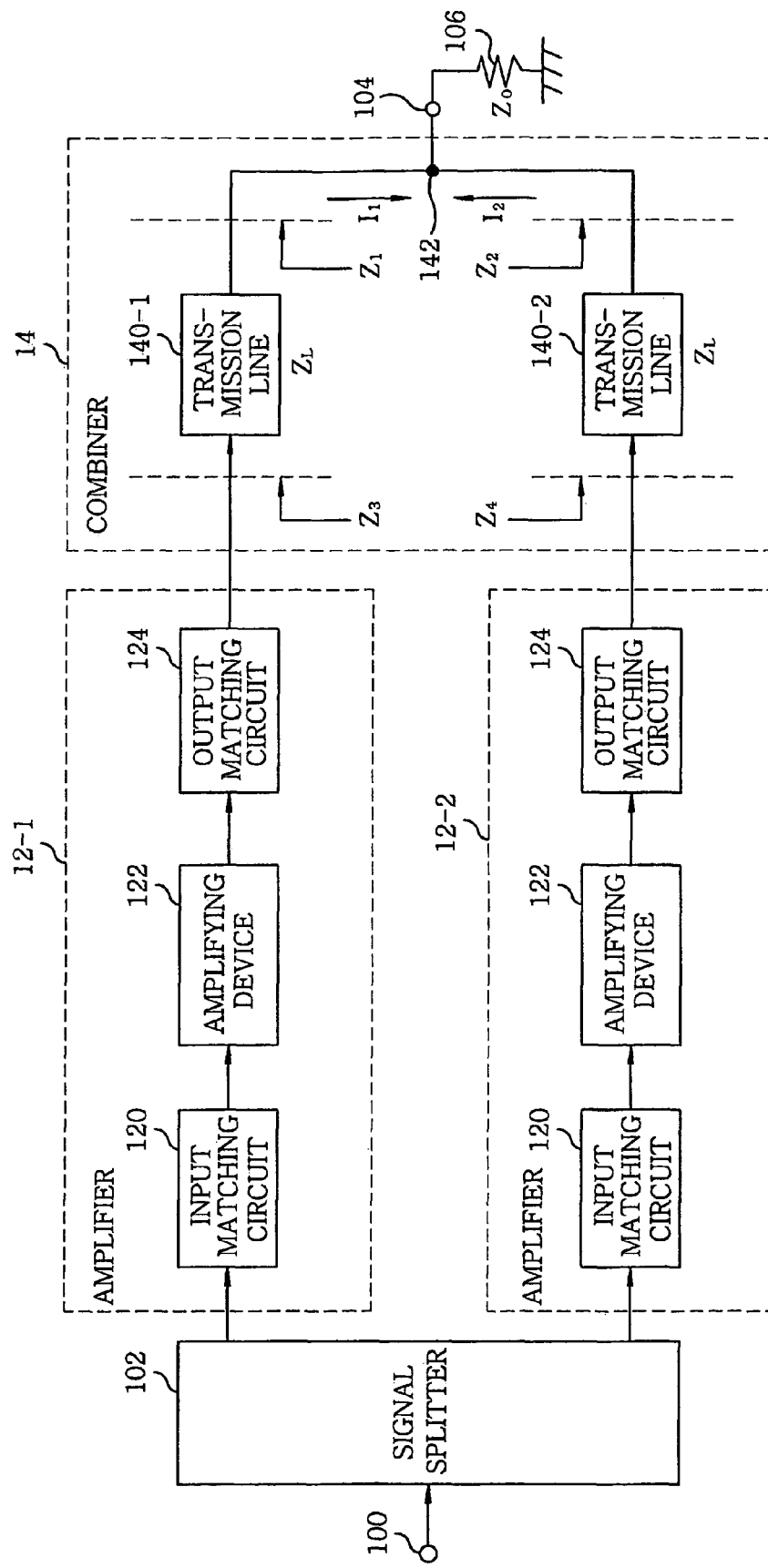
FIG. 1 shows the configuration of a first amplifying apparatus.

FIG. 1 shows the configuration of the first amplifying apparatus 1.

As shown in FIG. 1, the first amplifying apparatus 1 includes an input terminal 100, a signal splitter 102 (splitting unit), amplifiers 12-1 and 12-2, a combiner 14, an output terminal 104, and a load resistor 106.

The amplifiers 12-1 and 12-2 each include an input matching circuit 120, an amplifying device 122 (amplifying unit), and an output matching circuit 124.

The combiner 14 is constituted by a transmission line 140-1 (a first transmission unit), and a transmission line 140-2 (a second transmission unit).

Hereinafter, plural same components n-1 to n-m, e.g., the amplifiers 12-1 and 12-2 will be sometimes referred to simply as a component n, e.g., an amplifier 12.

Further, same reference numerals are given to substantially same components shown in respective drawings.

Figure 2:
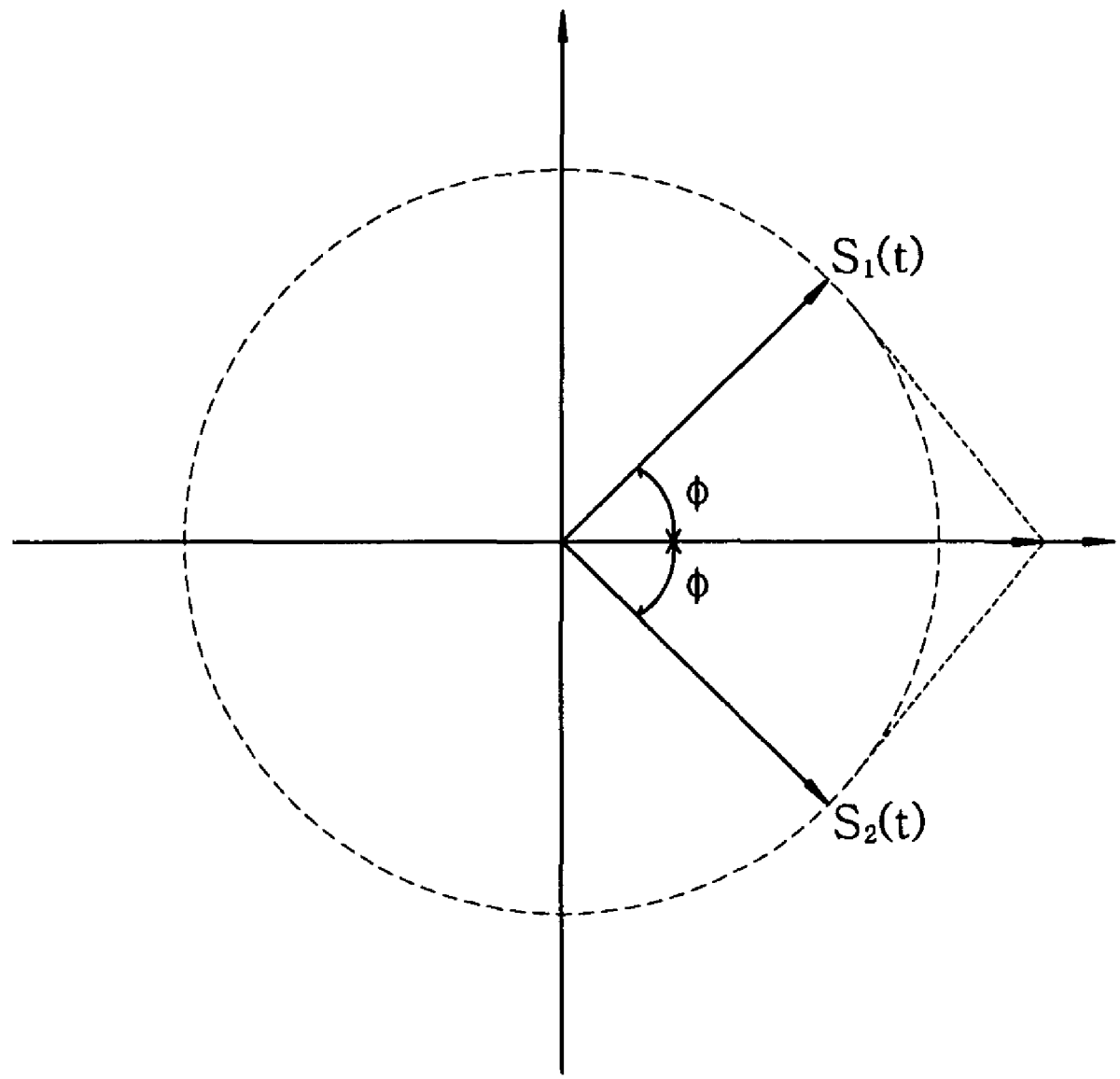
FIG. 2 illustrates signal vectors split by a signal splitter of the first amplifying apparatus shown in FIG. 1.

FIG. 2 shows vectors of signals split by the signal splitter 102.

As shown in FIG. 2, the signal splitter 102 splits an input signal $S_{in}(t)$ inputted from the input terminal 100 into signals $S_1(t)$ and $S_2(t)$ of a same amplitude, wherein a combined wave of two vectors has the same amplitude and phase as $S_{in}(t)$.

To be more specific, $S_{in}(t)$, $S_1(t)$ and $S_2(t)$ can be expressed as follows:

$$S_{in}(t) = r(t) \cdot \exp(j\theta(t)) \quad \text{Eq. 1-1}$$

$$S_1(t) = \frac{V_m}{2} \cdot \exp(j(\theta(t) + \phi(t))) \quad \text{Eq. 1-2}$$

$$S_2(t) = \frac{V_m}{2} \cdot \exp(j(\theta(t) - \phi(t))) \quad \text{Eq. 1-3}$$

$$S_{in}(t) = S_1(t) + S_2(t) \quad \text{Eq. 1-4}$$

Herein, Vm is a maximum value of $|r(t)|$.

From Eqs. 1-1 to 1-4, Eq. 2-1 presented below can be derived.

Further, Eq. 2-2 can be derived from Eq. 2-1, and Eqs. 2-3 and 2-4 can be obtained by Euler's formula.

Accordingly, $\phi(t)$ can be expressed as Eq. 2-5:

$$r(t) \cdot \exp(j\theta(t)) = \left[\frac{V_m}{2} \cdot \exp(+j\phi(t)) + \frac{V_m}{2} \cdot \exp(-j\phi(t))\right] \cdot \exp(j\theta(t)) \quad \text{Eq. 2-1}$$

$$r(t) = \frac{V_m}{2} \cdot \exp(+j\phi(t)) + \frac{V_m}{2} \cdot \exp(-j\phi(t)) \quad \text{Eq. 2-2}$$

$$r(t) = \frac{V_m}{2} \cdot 2\cos(\phi(t)) \quad \text{Eq. 2-3}$$

$$\cos(\phi(t)) = \frac{r(t)}{V_m} \quad \text{Eq. 2-4}$$

$$\phi(t) = \arccos\left(\frac{r(t)}{V_m}\right) \quad \text{Eq. 2-5}$$

From Eqs. 1-2, 1-3 and 2-5, the signal splitter 102 splits $S_{in}(t)$ into $S_1(t)$ and $S_2(t)$ by changing the phase $\phi(t)$ according to the amplitude of $S_{in}(t)$.

The input matching circuit 120 matches am impedance of a signal inputted from the signal splitter 102 to input impedance of the amplifying device 122 and outputs the impedance matched signal.

The amplifying device 122 is biased to Class AB, B or C, and amplifies a signal inputted from the input matching circuit 120 to thereby output the amplified signal to the output matching circuit 124.

The output matching circuit 124 outputs the signal outputted from the amplifying device 122 to the transmission line 140 while performing impedance matching therebetween.

The transmission line 140 is composed of $\lambda/4$-long microstrip line, and outputs the signal inputted from the output matching circuit 124 to the output terminal 104 via a combining point 142.

The output terminal 104 then outputs the signal, which has been inputted from the transmission line 140 via the combining point 142, to the load resistor 106.

At the combining point 142, input signals from the transmission line 140-1 and the transmission line 140-2 are combined.

When phases $\phi$ of both signals $S_1(t)$ and $S_2(t)$ are 0°, output signals from the amplifiers 12-1 and 12-2 are combined, by the combiner 14, as the same phase and provided to the load resistor 106 through the output terminal 104.

In addition, when phases $\phi$ of both signals $S_1(t)$ and $S_2(t)$ are 90°, output signals from the amplifiers 12-1 and 12-2 are combined, by the combiner 14, as inverse phase, which are cancelled out. Thus, an output from the combiner 14 becomes 0. That is, a voltage at the combining point 142 becomes 0, which is considered to be in a virtual ground state.

When the combining point 142 is grounded, impedance $Z_3$ seen from the input side of the transmission line 140-1 towards the combining point 142 goes to infinity.

Similarly, impedance $Z_4$ seen from the input side of the transmission line 140-2 towards the combining point 142 goes to infinity.

To obtain efficiency with the configuration of the combiner 14 shown in FIG. 1, the impedances $Z_3$ and $Z_4$ and load characteristics of the amplifying device 122 need to be considered.

The impedances $Z_3$ and $Z_4$ can be obtained in Eqs. 3-1 to 3-8 described below:

$$V_1 = \frac{V_{max}}{2} \cdot \exp(+j\phi) \quad \text{Eq. 3-1}$$

$$V_2 = \frac{V_{max}}{2} \cdot \exp(-j\phi) \quad \text{Eq. 3-2}$$

$$I_1 = \frac{V_{max}}{2Z_O} \cdot \exp(+j\phi) \quad \text{Eq. 3-3}$$

$$I_2 = \frac{V_{max}}{2Z_O} \cdot \exp(-j\phi) \quad \text{Eq. 3-4}$$

$$Z_1 = \frac{V}{I_1} = \frac{2Z_O V}{V_{max}} \cdot \exp(-j\phi) \quad \text{Eq. 3-5}$$

$$Z_2 = \frac{V}{I_2} = \frac{2Z_O V}{V_{max}} \cdot \exp(+j\phi) \quad \text{Eq. 3-6}$$

$$Z_3 = \frac{Z_L^2}{Z_1} \quad \text{Eq. 3-7}$$

$$Z_4 = \frac{Z_L^2}{Z_2} \quad \text{Eq. 3-8}$$

If an input signal with $\theta=0°$ is applied in Eq. 1-1, an output voltage $V_1$ of the amplifier 12-1, and an output voltage $V_2$ of the amplifier 12-2 can be expressed as Eqs. 3-1 and 3-2, respectively.

Here, $V_{max}$ denotes a maximum value of a voltage V applied to the load resistor 106.

$S_1(t)$ and $S_2(t)$ are respectively expressed as Eqs. 1-2 and 1-3 in consideration of phase $\theta$ of an input signal $S_{in}(t)$.

Since, however, their relative voltage and phase relations affect the impedance, the phase $\theta$ equally given for both signals is omitted in the above equations.

Current $I_1$ in FIG. 1 flowing across the combining point 142 from the transmission line 140-1, and current $I_2$ flowing across the combining point 142 from the transmission line 140-2 are described as in Eqs. 3-3 and 3-4, respectively.

Accordingly, the impedances $Z_1$ and $Z_2$ can be expressed as in Eqs. 3-5 and 3-6, respectively.

The impedance $Z_1$ is converted in the transmission line 140-1, and the impedance $Z_2$ is converted in the transmission line 140-2, and thus, the impedances $Z_3$ and $Z_4$ can be presented as in Eqs. 3-7 and 3-8, respectively.

Figure 3A:
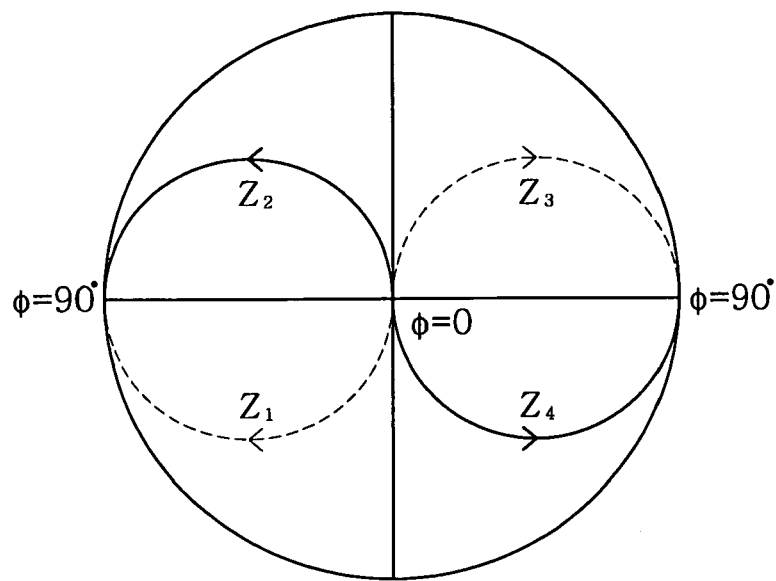
FIG. 3A shows changes in impedances $Z_1$, $Z_2$, $Z_3$ and $Z_4$ on a Smith Chart for the shift of $\phi$ of $V_1$ and $V_2$ from 0° to 90°.
Figure 3B:
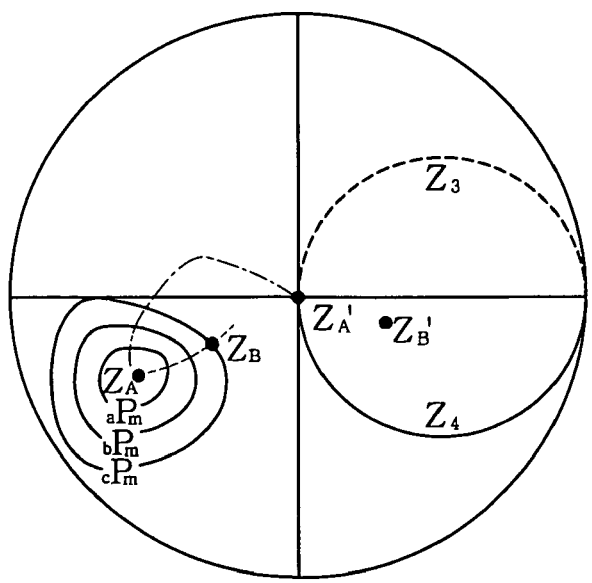
FIG. 3B shows changes in $Z_3$ and $Z_4$ shown in FIG. 3A on a Smith Chart exemplifying variations in output power and efficiency for load impedance of an amplifying device of the first amplifying apparatus shown in FIG. 1.

FIG. 3A shows changes in impedances $Z_1$, $Z_2$, $Z_3$ and $Z_4$ on a Smith Chart for the shift of $\phi$ of $V_1$ and $V_2$ from 0° to 90°, and FIG. 3B shows changes in $Z_3$ and $Z_4$ shown in FIG. 3A on a Smith Chart exemplifying variations in output power and efficiency for load impedance of an amplifying device of the first amplifying apparatus shown in FIG. 1.

A radio-frequency amplifying device has an output power and an efficiency determined depending on a load impedance connected to the amplifying device.

That is, an output power and an efficiency of the amplifier 12-1 are determined depending on the impedance $Z_3$, and an output power and an efficiency of the amplifier 12-2 are determined depending on the impedance $Z_4$.

As shown in FIG. 3B, $Z_A$ is a load impedance when a maximum output $P_m$ is obtained for the amplifying device 122. Typically, it ranges from several Ω to less than twenty Ω and is not a pure resistance.

Three closed curves drawn around $Z_A$ are contour lines of equi-output power corresponding to a×Pm, b×Pm and c×Pm, respectively, starting from the inner side.

Here, a, b and c are coefficients satisfying the condition of 1>a>b>c>0, for example, a=0.9, b=0.8, and c=0.7.

$Z_B$ is impedance with the highest efficiency in c×Pm.

The dotted lines crossing the equivalent output power line seen from $Z_A$ towards $Z_B$ connect load impedances with good efficiency in predetermined output levels. When there is a change in the load, higher efficiency is obtained closer to the dotted lines.

An output matching circuit of the amplifying device needs to be designed to provide a maximum output.

In LINC system, the maximum output is obtained when φ=0°. Thus, the output matching circuit 124 is designed in a manner that $Z_A$ is converted to $Z_3$ or $Z_4$ when φ=0°.

That is, the output matching circuit 124 converts $Z_A$ to $Z_3$ or $Z_4$ when φ=0°.

In FIG. 3B, $Z_A'$ and $Z_B'$ are converted impedances, by the output matching circuit 124, from $Z_A$ and $Z_B$.

In other words, the output matching circuit 124 converts $Z_A$ and $Z_B$ into $Z_A'$ and $Z_B'$, respectively.

Moreover, as shown in FIG. 3B, although $Z_3$ or $Z_4$ are at $Z_A'$, wherein a maximum output is outputted when φ=0°, if the output is lowered from the maximum output, i.e., if the phase φ is changed from 0° to 90°, the tracks of $Z_3$ or $Z_4$ become more distant from $Z_B'$. Thus, the efficiency of each of the amplifier 12-1 and 12-2 is degraded.

A second amplifying apparatus 2 and a third amplifying apparatus 3 to be described below are improved to resolve the foregoing problems.

(Second Amplifying Apparatus 2)

Hereinafter a second amplifying apparatus 2 in accordance with the embodiment of the present invention will be described.

Figure 4:
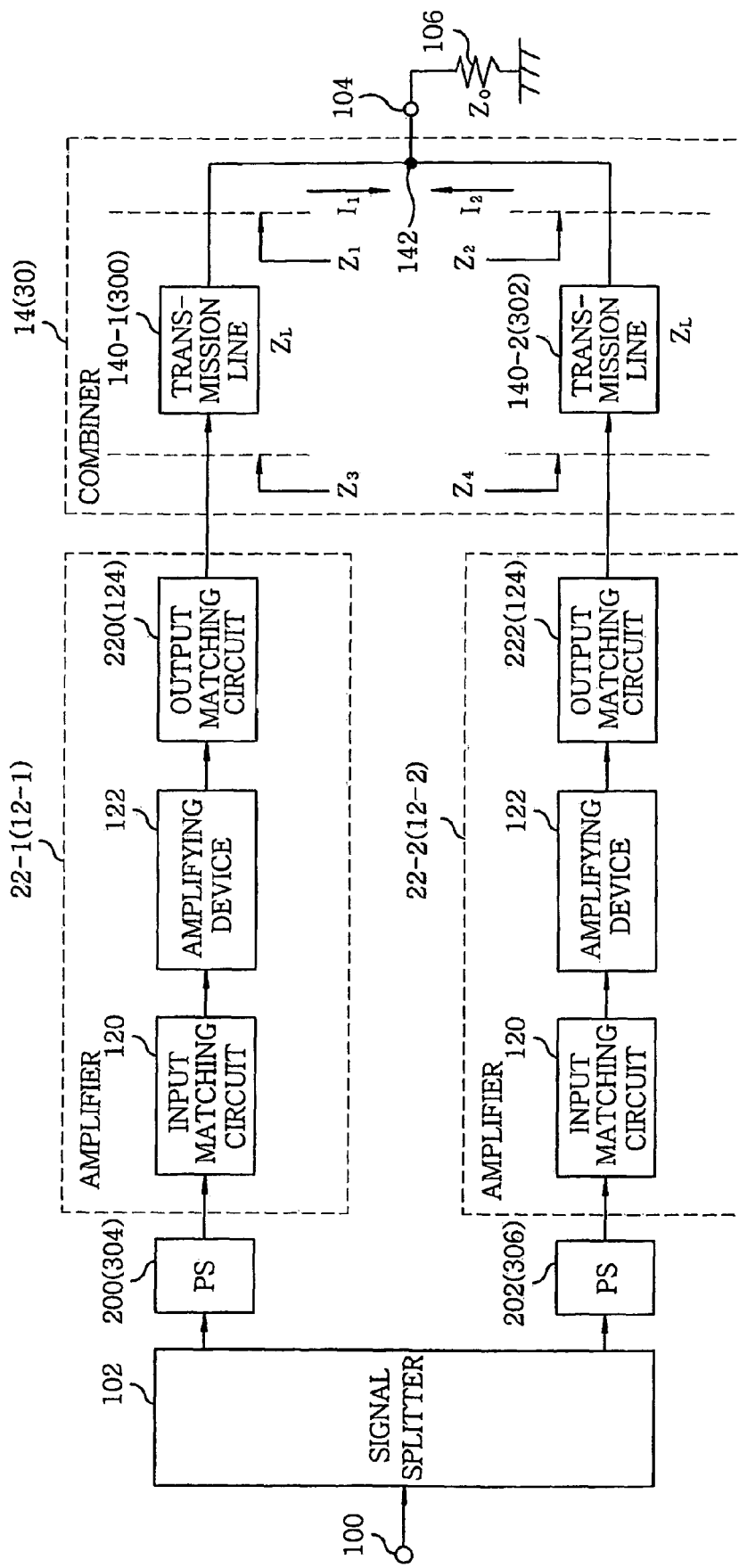
FIG. 4 illustrates configurations of a second and a third amplifying apparatus in accordance with the present invention.

FIG. 4 illustrates configurations of the second amplifying apparatus 2 and a third amplifying apparatus 3, in accordance with the present invention.

Referring to FIG. 4, the second amplifying apparatus 2 has the same configuration as the first amplifying apparatus 1, except that the amplifier 12-1 is substituted with an amplifier 22-1 and the amplifier 12-2 is substituted with an amplifier 22-2, and phase shifters 200 and 202 (phase-shifting unit) are further included.

The amplifier 22-1 has the same configuration of the amplifier 12-1, except that the output matching circuit 124 is substituted with an output matching circuit 220 (matching unit).

Likewise, the amplifier 22-2 has the same configuration of the amplifier 12-1, except that the output matching circuit 124 is substituted with an output matching circuit 222 (matching unit).

In the output matching circuit 220, the amplifying device 122 and the transmission line 140-1 are connected with impedance conversion, so that an input signal of the amplifying device 122 is outputted to the transmission line 140.

In the output matching circuit 222, the amplifying device 122 and the transmission line 140-2 are connected with impedance conversion, and outputs an input signal of the amplifying device 122 is outputted to the transmission line 140.

Figure 5A:
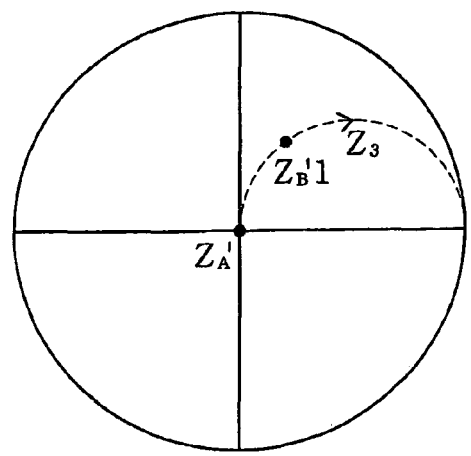
FIG. 5A shows changes in impedances $Z_A{}'$ and $Z_B{}'1$ converted, by am output matching circuit 220 shown in FIG. 4, from $Z_A$ and $Z_B$ shown in FIG. 3B and a change of $Z_3$ shown in FIG. 3A on a Smith chart.
Figure 5B:
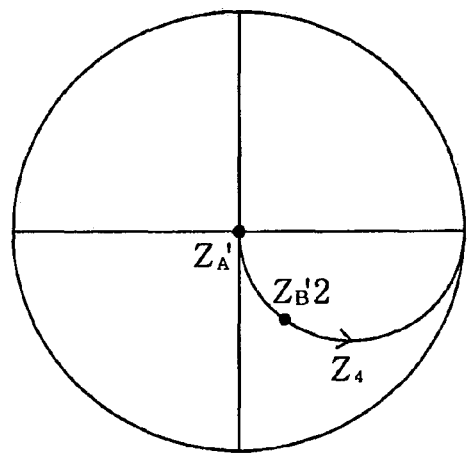
FIG. 5B shows changes in impedances $Z_A{}'$ and $Z_B{}'2$ converted, by an output matching circuit 222 shown in FIG. 4, from $Z_A$ and $Z_B$ shown in FIG. 3B and a change of $Z_4$ shown in FIG. 3A.
Figure 5C:
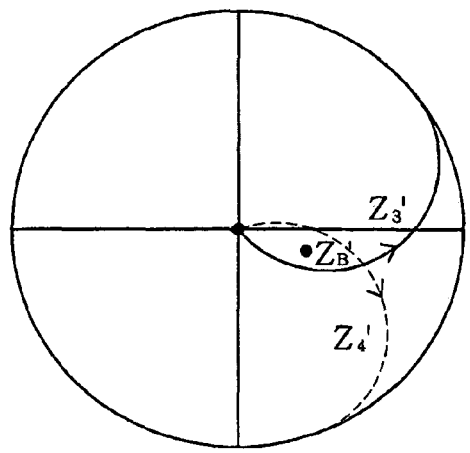
FIG. 5C shows tracks of $Z_3{}'$ and $Z_4{}'$ on a Smith Chart when a transmission line 300 and a transmission line 302 shown in FIG. 5 are set to arbitrary lengths L1 and L2, respectively.

FIG. 5A shows changes in impedances $Z_A'$ and $Z_B'1$ converted, by am output matching circuit 220 shown in FIG. 4, from $Z_A$ and $Z_B$ shown in FIG. 3B and a change of $Z_3$ shown in FIG. 3A on a Smith chart; FIG. 5B shows changes in impedances $Z_A'$ and $Z_B'2$ converted, by an output matching circuit 222 shown in FIG. 4, from $Z_A$ and $Z_B$ shown in FIG. 3B and a change of $Z_4$ shown in FIG. 3A; and FIG. 5C shows tracks of $Z_3'$ and $Z_4'$ on a Smith Chart when a transmission line 300 and a transmission line 302 shown in FIG. 5 are set to arbitrary lengths L1 and L2, respectively. FIG. 5C shows tracks of $Z_3'$ and $Z_4'$ on a Smith Chart in the third amplifying apparatus 3 to be described later, wherein a transmission line 300 substituted for the transmission line 140-1 in FIG. 1 is set to an arbitrary length L1 and a transmission line 302 substituted for the transmission line 140-2 in FIG. 1 is set to an arbitrary length L2.

Referring to FIG. 5A, the output matching circuit 220 converts $Z_A$ and $Z_B$ shown in FIG. 3B into $Z_A'$ and $Z_B'1$, respectively.

Referring to 5B, the output matching circuit 222 converts $Z_A$ and $Z_B$ shown in FIG. 3B into $Z_A'$ and $Z_B'2$, respectively.

The phase shifter (PS) 200 changes a phase of a signal inputted from the signal splitter 102 by a predetermined amount of phase and outputs the phase-shifted signal to the input matching circuit 120.

Specifically, as to a phase difference between the output matching circuit 220 and the output matching circuit 222, if the input signal phase of the output matching circuit 220 is smaller by an amount Δφ, the phase shifter 200 increases the phase of an input signal from the signal splitter 102 by Δφ.

The phase shifter 202 changes a phase of a signal inputted from the signal splitter 102 by a predetermined amount of phase and outputs the phase-shifted signal to the input matching circuit 120.

Specifically, as to a phase difference between the output matching circuit 220 and the output matching circuit 222, if the input signal phase of the output matching circuit 222 is smaller by an amount Δφ, the phase shifter 202 increases the phase of an input signal from the signal splitter 102 by Δφ.

That is, the output matching circuit 220 converts the impedances $Z_A$ and $Z_B$ such that the converted impedances of $Z_A$ and $Z_B$ are plotted on the track of $Z_3$ and the output matching circuit 222 converts the impedances $Z_A$ and $Z_B$ such that the converted impedances of $Z_A$ and $Z_B$ are plotted on the track of $Z_4$. Therefore, even if φ of an input signal has been changed, the amplifying devices 22-1 and 22-2 can still amplify the signal at high efficiency.

In addition, the phase shifters 200 and 202 correct a phase difference between the amplifiers 22-1 and 22-2 caused by the difference in the output matching circuit 220 and 222.

As noted earlier, the second amplifying apparatus 2 includes the phase shifters 200 and 202 additionally. However, instead of having the phase shifter 200, it may correct a phase difference between the amplifiers 22-1 and 22-2 by adjusting length of the transmission line 140-1.

Similarly, instead of having the phase shifter 202, it may correct a phase difference between the amplifiers 22-1 and 22-2 by adjusting length of the transmission line 140-2.

That is to say, the second amplifying apparatus 2 may be configured to have only the phase shifter 200 or only the phase shifter 202.

In addition, instead of the phase shifters 200 and 202, the signal splitter 102 may correct a phase difference between the amplifiers 22-1 and 22-2.

That is, for example, the phase-corrected $S_1(t)$ can be expressed as the following Eq. 4:

$$S_1(t) = \frac{V_m}{2} \cdot \exp(j(\theta(t) + \phi(t) + \Delta\phi))  \quad \text{Eq. 4}$$

(Overall Operation of the Second Amplifying Apparatus 2)

Now, an overall operation of the second amplifying apparatus 2 will be described in detail.

The signal splitter 102 splits an input signal, which can be expressed as a complex vector, into two signals of a same amplitude, namely, a first split signal to which a first phase shift amount is added and a second split signal to which a second phase shift amount is added. A signal obtained by combining those split signals is expressed as a same complex vector of the input signal.

The first split signal phase-shifted by the phase shifter 200 is amplified by the amplifying device 122 in the amplifier 22-1, matched by the output matching circuit 220, and fed to the load resistor 106 as a first output signal through the transmission line 140-1. The second split signal phase-shifted by the phase shifter 202 is amplified by the amplifying device 122 in the amplifier 22-2, matched by the output matching circuit 222, and fed to the load resistor 106 as a second output signal through the transmission line 140-2, whereby the phases of the first and the second output signals are matched by the phase shifters 200 and 202.

The amplifying device 122 in the amplifier 22-1 amplifies the first split signal phase-shifted by the phase shifter 200.

The amplifying device 122 in the amplifier 22-2 has same characteristics as the amplifying device 122 in the amplifier 22-1, and amplifies the second split signal phase-shifted by the phase shifter 202.

The output matching circuit 220 matches the amplifying device 122 in the amplifier 22-1 to the load resistor 106 by executing a first conversion. The first conversion involves loading of complex impedances $Z_A$ and $Z_B$ of the first output signal, which can be taken by performing the amplification with a predetermined efficiency or higher by the amplifying device 122 in the amplifier 22-1, onto or close to the track of the complex impedance $Z_3$ which a load having passed through the transmission line 140-1 can take.

The output matching circuit 222 matches the amplifying device 122 of the amplifier 22-2 to the load resistor 106 by executing a first conversion. The first conversion involves loading of complex impedances $Z_A$ and $Z_B$ of the second output signal, which can be taken by performing the amplification with a predetermined efficiency or higher by the amplifying device 122 in the amplifier 22-2, onto or close to the track of the complex impedance $Z_4$ which a load having passed through the transmission line 140-2 can take.

The transmission line 140-1 transmits the first split signal outputted from the output matching circuit 220 to the load resistor 106, and the transmission line 140-2 transmits the second split signal outputted from the output matching circuit 222 to the load resistor 106. The first split signal being transmitted through the transmission line 140-1, and the second split signal being transmitted through the second transmission unit are combined at a combining point 142 and supplied to the load resistor 106.

(Third Amplifying Apparatus 3)

Hereinafter, the third amplifying apparatus 3 will be discussed.

Again, referring to FIG. 4, the third amplifying apparatus 3 has a same configuration as the first amplifying apparatus 1, except that the combiner 14 is substituted with a combiner 30 and phase shifters 304 and 306 (phase-shifting unit) are further included.

The combiner 30 has a same configuration of the combiner 14, except that the transmission line 140-1 is substituted with a transmission line 300 (matching unit) and the transmission line 140-2 is substituted with a transmission line 302 (matching unit).

The transmission line 300 is obtained by appropriately varying the length of the transmission line 140-1.

The transmission line 302 is obtained by appropriately varying the length of the transmission line 140-2.

Here, suppose that the length of the transmission line 300 is L1, and the length of the transmission line 302 is L2. Then, $Z_3'$ seen from the transmission line 300 toward the side of the combining point 142, and $Z_4'$ seen from the transmission line 302 toward the side of the combining point 142 can be expressed as the following Eqs. 5-1 and 5-2, respectively.

$$Z_3' = Z_L \frac{Z_1 + jZ_L \tan\left(\frac{2\pi}{\lambda}L_1\right)}{Z_L + jZ_1 \tan\left(\frac{2\pi}{\lambda}L_1\right)} \quad \text{Eq. 5-1}$$

$$Z_4' = Z_L \frac{Z_2 + jZ_L \tan\left(\frac{2\pi}{\lambda}L_2\right)}{Z_L + jZ_2 \tan\left(\frac{2\pi}{\lambda}L_2\right)} \quad \text{Eq. 5-2}$$

As shown in FIG. 5C, by appropriately setting the length L1 of the transmission line 300 and the length L2 of the transmission line 302, the impedance track obtained when $\phi$ varies can be changed close to $Z_B'$ from $Z_A'$.

That is, even when $\phi$ is changed, the amplifier 12-1 and the amplifier 12-2 can amplify a signal at high efficiency by appropriately setting the length L1 of the transmission line 300 and the length L2 of the transmission line 302.

The phase shifter 304 changes the phase of a signal inputted from the signal splitter 102 by a predetermined amount of phase and outputs the phase-shifted signal to the input matching circuit 120.

The phase shifter 306 changes the phase of a signal inputted from the signal splitter 102 by a predetermined amount of phase and outputs the phase-shifted signal to the input matching circuit 120.

To be more specific, the phase shifters correct a phase difference that occurs by a length difference between the transmission lines 300 and 302.

While the third amplifying apparatus 3 further includes the phase shifters 304 and 306, it may be configured to have only the phase shifter 304 or only the phase shifter 306.

In addition, instead of the phase shifters 304 and 306, the signal splitter 102 may correct a phase difference that occurs by a length difference between the transmission lines 300 and 302.

(Overall Operation of the Third Amplifying Device 3)

Hereinafter, an overall operation of the third amplifying apparatus 3 will be described in detail.

The signal splitter 102 splits an input signal, which can be expressed as a complex vector, into two signals of a same amplitude, i.e., a first split signal to which a first phase shift amount is added and a second split signal to which a second phase shift amount is added. A signal obtained by combining those split signals is expressed as a same complex vector of the input signal.

The first split signal phase-shifted by the phase shifter 304 is amplified by the amplifying device 122 in the amplifier 12-1, matched by the output matching circuit 124, and fed to the load resistor 106 as a first output signal through the transmission line 300. The second split signal phase-shifted by the phase shifter 306 is amplified by the amplifying device 122 in the amplifier 12-2, matched by the output matching circuit 222, and fed to the load resistor 106 as a second output signal through the transmission line 302, whereby the phases of the first and the second output signals are matched by the phase shifters 200 and 202.

The amplifying device 122 in the amplifier 12-1 amplifies the first split signal phase-shifted by the phase shifter 304.

The amplifying device 122 in the amplifier 12-2 has a same characteristics as the amplifying device 122 in the amplifier 12-1, and amplifies the second split signal phase-shifted by the phase shifter 306.

When a phase shift amount added by the signal splitter 102 to the first split signal is equal to or less than a predetermined value, and a complex impedance of an output signal from the amplifying device 122 is converted ($Z_A$ being converted into $Z_A'$ in FIG. 3B) to make the output signal from the amplifying device 122 have a power of a predetermined level or larger, the transmission line 300 matches the amplifying device 122 to the load resistor 106 by executing a second conversion. The second conversion involves making a track of the complex impedance $Z_3$, which a load having passed through the transmission line 300 can take, to pass through or lie close to the converted complex impedances ($Z_A'$ and $Z_B'$ in FIG. 3B) of the first output signal, which can be taken by performing the amplification with a predetermined efficiency or higher by the amplifying device 122.

When a phase shift amount added by the signal splitter 102 to the second split signal is equal to or less than a predetermined value, and a complex impedance of an output signal from the amplifying device 122 is converted (being converted $Z_A$ into $Z_A'$ in FIG. 3B) to make the output signal from the amplifying device 122 have a power of a predetermined level or larger, the transmission line 302 matches the amplifying device 122 to the load resistor 106 by executing the second conversion. The second conversion involves making the track of the complex impedance $Z_4$, which a load having passed through the transmission line 302 can take, to pass through or close to the converted complex impedances ($Z_A'$ and $Z_B'$ in FIG. 3B) of the second output signal which can be taken by performing the amplification with a predetermined efficiency or higher by the amplifying device 122.

The transmission line 300 (the first transmission unit) transmits the first split signal outputted from the output matching circuit 124 in the amplifier 12-1 to the load resistor 106, and the transmission line 302 (the second transmission unit) transmits the second split signal outputted from the output matching circuit 124 in the amplifier 12-2 to the load resistor 106. The first split signal transmitted through the transmission line 300, and the second split signal transmitted through the transmission line 302 are combined at the combining point 142 and supplied to the load resistor 106.

Figure 6:
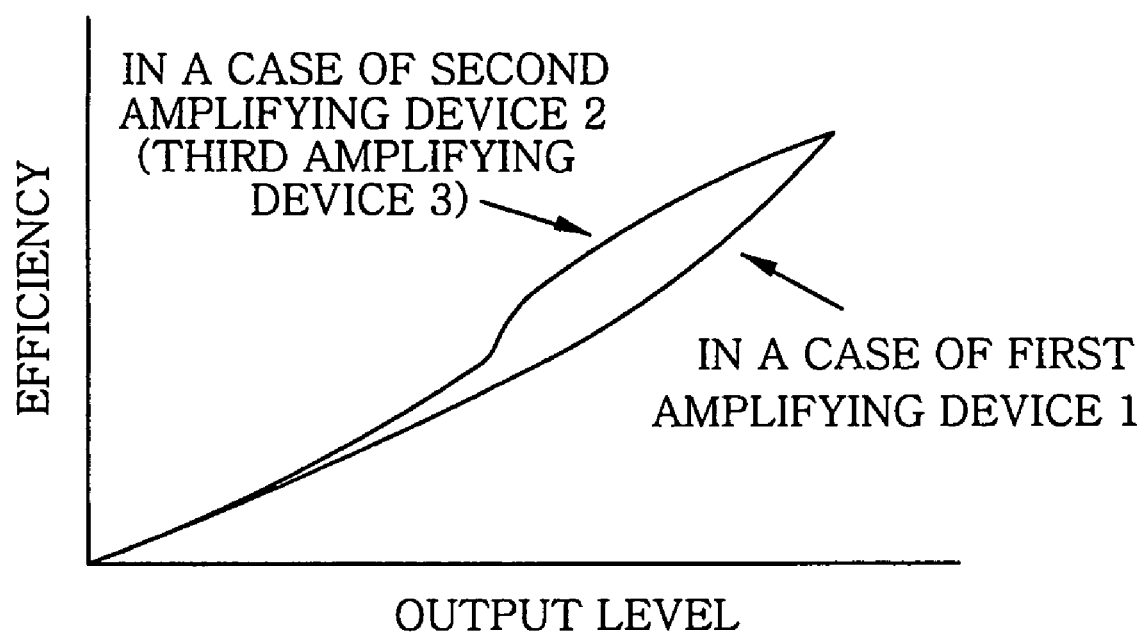
FIG. 6 shows a comparison of efficiencies between the first amplifying apparatus and the second amplifying apparatus (or the third amplifying apparatus).

FIG. 6 shows a comparison of efficiencies between the first amplifying apparatus 1 and the second amplifying apparatus 2 (or the third amplifying apparatus 3).

On a graph depicted in FIG. 6, the horizontal axis denotes output level, and the vertical axis denotes efficiency.

As can be seen from the graph, the second amplifying apparatus 2 (or the third amplifying apparatus 3) has improved its efficiency, compared with the first amplifying apparatus 1.

As described above, the amplifying device of the present invention can amplify signals at high efficiency.

While the present invention has been described with respect to the preferred embodiments, it will be apparent to those skilled in the art that various changes and modifications may be made without departing from the scope of the invention as defined in the following claims.

What is claimed is:

1. An amplifying apparatus, comprising:

a splitting unit for splitting an input signal into a first split signal and a second split signal;

phase-shifting unit for phase-shifting the first split signal and the second split signal, respectively;

a first amplifying unit for amplifying a first phase-shifted signal and outputting the signal as a first output signal;

a second amplifying unit for amplifying, in a substantially identical manner to the first amplifying unit, a second phase-shifted signal and outputting the signal as a second output signal;

a matching unit for matching the first output signal and the second output signal to a first transmission unit and a second transmission unit, respectively;

the first transmission unit for transmitting the first output signal from the matching unit to a load resistor; and the second transmission unit for transmitting the second output signal from the matching unit to the load resistor, wherein the first split signal and the second split signal have a same amplitude, and a combined signal of the first split signal and the second split signal is expressed as a complex vector identical to that of the input signal, wherein the phase-shifting unit phase-shifts the first and the second split signals, respectively, so that the first output signal phase added to the load resistor is identical to the second output signal phase added to the load resistor, wherein the matching unit executes a first conversion that involves loading of a complex impedance of each of the first and the second output signals, which are respectively taken by performing the amplification with a predetermined efficiency or higher by the first and the second amplifying unit, onto or close to a track of a complex impedance which a load having passed through the first transmission line takes, or onto or close to a track of a complex impedance which a load having passed through the second transmission line takes; or when a phase shift amount added by the splitting unit to the first split signal and the second split signal obtained by the splitting unit is equal to or less than a predetermined value, and a complex impedance of an output signal from each of the first amplifying unit and the second amplifying unit is converted to satisfy conditions where an output signal from each of the first and the second amplifying unit has a power of a predetermined level or larger and power efficiency of each of the amplifying unit is equal to or higher than a predetermined level, a second conversion involving making a track of each of complex impedances, which a load having passed through either the first transmission line or the second transmission line can take, to pass through or lie close to each of the converted complex impedances of the first and the second output signal, and wherein the first transmission unit and the second transmission unit combine the first output signal and the second output signal and supply the combined signal to the load resistor.

* * * * *